United States Patent [19]

Stevens

[11] Patent Number: 5,070,036
[45] Date of Patent: Dec. 3, 1991

[54] PROCESS FOR CONTACTING AND INTERCONNECTING SEMICONDUCTOR DEVICES WITHIN AN INTEGRATED CIRCUIT

[75] Inventor: E. Henry Stevens, Colorado Springs, Colo.

[73] Assignee: Quality Microcircuits Corporation, Colorado Springs, Colo.

[21] Appl. No.: 525,444

[22] Filed: May 18, 1990

Related U.S. Application Data

[62] Division of Ser. No. 293,438, Jan. 4, 1989, Pat. No. 4,977,440.

[51] Int. Cl.$^5$ ............................................. H01L 21/44
[52] U.S. Cl. .................................. 437/190; 437/192; 437/194; 437/200; 357/71
[58] Field of Search ............... 437/190, 192, 194, 200; 357/715

[56] References Cited

U.S. PATENT DOCUMENTS

| | | | |
|---|---|---|---|
| 3,906,540 | 9/1975 | Hollins | 357/15 |
| 4,680,612 | 7/1987 | Hieber et al. | 357/71 S |
| 4,784,973 | 11/1988 | Stevens et al. | 437/200 |
| 4,829,024 | 5/1989 | Klein et al. | 437/192 |
| 4,910,580 | 3/1990 | Kuecher et al. | 357/67 |
| 4,926,237 | 5/1990 | Sun et al. | 357/67 |

FOREIGN PATENT DOCUMENTS

| | | | |
|---|---|---|---|
| 61-156872 | 7/1986 | Japan | |
| 61-183942 | 8/1986 | Japan | 437/200 |

OTHER PUBLICATIONS

R. V. Joshi et al., "Novel Self-Aligned W/TiN/TiSi$_2$ Contact Structure", Applied Physics Letters, 54 (17) Apr. 24, '89, pp. 1672–1674.

J. R. Black, "Physics of Electromigration", Proceedings of 12th Reliability Physics Symposium, pp. 142–149, 1974.

J. G. J. Chern, W. G. Oldham, and N. Cheung, "Electromigration in Al/Si Contacts–Induced Open-Circuit Failures", IEEE Transactions on Electron Devices, vol. ED-33, pp. 1256–1262, 1986.

J. G. J. Chern, W. G. Oldham, and N. Cheung, "Contact-Electromigration-Induced Leakage Failure in Aluminum–Silicon to Silicon Contacts", IEEE Transactions on Electron Devices, vol. ED-32, pp. 1341–1346, 1985.

P. A. Flinn, D. S. Gardner, and W. D. Nix, "Measurement and Interpretation of Stress in Aluminum–Based Metallization as a Function of Thermal History", IEEE Transactions on Electron Devices, vol. ED-34, pp. 689–699, 1987.

J. W. McPherson and C. F. Dunn, "A Model for Stress –Induced Metal Notching and Voiding in Very-Large-Scale Integrated Al-Si (1%) Metallization", Journal of Vacuum Science and Technology, vol. B5, pp. 1321–1325, 1987.

(List continued on next page.)

Primary Examiner—Brian E. Hearn
Assistant Examiner—Laura M. Holtzman
Attorney, Agent, or Firm—William E. Hein

[57] ABSTRACT

An improved structure and process for contacting and interconnecting semiconductor devices within a VLSI integrated circuit are described. The structure includes several regions which cooperate to provide (1) contacts of low electrical resistance to semiconductor device terminals, (2) barriers to unwanted metallurgic reactions, (3) strong bonds between major regions of the structure, (4) overall mechanical strength, (5) a primary current path of low electrical resistance, (6) a secondary current path in parallel with the primary current path, and (7) circuit bond pads for use in making electrical connections to the VLSI circuit. Because of the structure's mechanical strength, semiconductor devices may be placed beneath circuit bond pads. The inventive process facilitates accurate control of the composition and thickness of each of the several regions within the material structure.

17 Claims, 3 Drawing Sheets

OTHER PUBLICATIONS

D. S. Gardner, T. L. Michalka, K. C. Sawaswat, T. W. Barbee, J. P. McVitte, and J. D. Meindl, "Layered and Homogeneous Films of Aluminum and Aluminum/Silicon with Titanium and Tungsten for Multilevel Interconnects", IEEE Transactions on Electron Devices, vol. ED-32, pp. 174–183, 1985.

K. Hinode, N. Owada, T. Terada and S. Iwata, "Silicon Take-Up by Aluminum Layered with Refractory Metals", IEEE Transactions on Electron Devices, vol. ED-34 pp. 700–705, 1987.

R. E. Jones and L. D. Smith, "Contact Spiking and Electromigration Passivation Cracking Observed for Titanium Layered Aluminum Metallization", Proceedings of the IEEE VLSI Multilevel Interconnect Conference, 1985.

I. Suni, M. Maenpaa, and M. A. Nicolet, "Thermal Stability of Hafnium and Titanium Nitride Diffusion Barriers in Multilayer Contacts to Silicon", Journal of the Electrochemical Society, 130 No. 5, pp. 1215–1218, 1983.

S. S. Ang, "Titanium Nitride Films with High Oxygen Concentration", Journal of Electronic Materials, vol. 17 No. 2, pp. 95–100, 1988.

P. J. Rosser and G. J. Tomkins, "Self Aligned Nitridation of $TiSi_2$: A $TiN/TiSi_2$ Contact Structure", Material Research Society Symposiuim Proceedings, 1985.

M. Wittmer, "Interfacial Reactions Between Aluminum and Transition-Metal Nitride and Carbide Films", Journal of Applied Physics, vol. 53, No. 2, pp. 1007–1012, 1982.

P. Singer, "Multi-Chip Packaging on Silicon Substrates", Semiconductor International, p. 34, Jun. 1987.

R. Bowlby, "The DIP May Take its Final Bows", IEEE Spectrum, pp. 37–42, Jun. 1985.

PROCESS FOR CONTACTING AND INTERCONNECTING SEMICONDUCTOR DEVICES WITHIN AN INTEGRATED CIRCUIT

This is a division of application Ser. No. 07/293,438 filed on Jan. 4, 1989, now issued as U.S. Pat. No. 4,977,440.

BACKGROUND OF THE INVENTION

This invention relates generally to integrated circuits and more particularly to a structure and process for contacting and interconnecting semiconductor devices within an integrated circuit. An integrated circuit comprises an ensemble of semiconductor devices. The semiconductor devices are principally formed in a single-crystal semiconductor wafer. A thin dielectric layer either grown on or deposited on the wafer surface and regions of polycrystalline semiconductor material deposited on the thin dielectric layer are integral parts of many semiconductor devices. A relatively thick dielectric layer is deposited over the semiconductor devices, and contact openings are etched through this dielectric layer to provide access to terminals of the semiconductor devices. The ensemble of semiconductor devices is interconnected (integrated) by a complex pattern of metal lines running on top of the thick dielectric layer. The lines contact terminals of the semiconductor devices through the openings in the dielectric layer. A protective coating is applied after formation of the interconnect pattern. Openings are made through the protective coating to provide access to square features of the interconnect pattern called bond pads. Electrical connections to the integrated circuit are made at the bond pads. A very-large-scale integrated (VLSI) circuit may contain over one million semiconductor devices, include several meters of interconnect line length, and have more than one hundred bond pads placed around the circuit perimeter.

Today, most integrated circuits are manufactured using silicon wafers, and an aluminum alloy is almost always used to interconnect the silicon semiconductor devices. A low concentration (typically, 1 percent) of silicon is incorporated in the aluminum alloy to prevent excessive absorption of silicon from terminal regions of the semiconductor devices. A low concentration (typically, 0.5 to 4 percent) of a metal such as copper is often incorporated in the aluminum alloy to improve its mechanical stability.

When the density of semiconductor devices in VLSI circuits became great enough to require that interconnect line widths be decreased to less than about 2 micrometers, aluminum alloys of uniform composition became inadequate as a material for the lines. At such narrow line widths, current densities in VLSI circuits can be in the range of 1 million amperes per square centimeter. At current densities on the order of 1 million amperes per square centimeter, the rate of electron interactions with aluminum ions is sufficient to cause migration (electromigration) of aluminum in the direction of the electron flow. Electromigration of aluminum causes integrated circuits to fail due to the formation of voids (open circuits) in the interconnect lines. See J. R. Black, "Physics of Electromigration", Proceedings of 12th Reliability Physics Symposium, pp 142-149, 1974 and J. G. J. Chern, W. G. Oldham, and N. Cheung, "Electromigration in Al/Si Contacts-Induced Open-Circuit Failures", IEEE Transactions on Electron Devices, Vol ED-33, pp 1256-1262, 1986. Interactions between the electron stream and silicon at contacts to semiconductor device terminals can also cause circuit failures due to extraction of silicon from the terminals. See J. G. J. Chern, W. G. Oldham, and N. Cheung, "Contact-Electromigration-Induced Leakage Failure in Aluminum-Silicon to Silicon Contacts", IEEE Transactions on Electron Devices, Vol. ED-32, pp 1341-1346, 1985. Because the thermal expansion coefficients of aluminum alloys and silicon do not match, thermal cycles used in integrated circuit manufacturing cause stresses which exceed the yield strength of narrow interconnect lines. See P. A. Flinn, D. S. Gardner, and W. D. Nix, "Measurement and Interpretation of Stress in Aluminum-Based Metallization as a Function of Thermal History", IEEE Transactions on Electron Devices, Vol. ED-34, pp 689-699, 1987. When the lines yield, circuits fail due to formation of aluminum voids. See J. W. McPherson and C. F. Dunn, "A Model for Stress-Induced Metal Notching and Voiding in Very-Large-Scale Integrated Al-Si (1%) Metallization", Journal of Vacuum Science and Technology, Vol. B5, pp 1321-1325, 1987.

Structures of alternating layers of an aluminum alloy and a refractory metal have been proposed as a material for narrow-width interconnect lines. See D. S. Gardner, T. L. Michalka, K. C. Saraswat, T. W. Barbee, J. P. McVitte, and J. D. Meindl, "Layered and Homogeneous Films of Aluminum and Aluminum/Silicon with Titanium and Tungsten for Multilevel Interconnects", IEEE Transactions on Electron Devices, Vol. ED-32, pp 174-183, 1985. These layered material structures are able to sustain much higher current densities than aluminum alloys of uniform composition. These layered structures are also mechanically much stronger than uniform alloys; therefore, the layered structures are able to survive more severe thermal cycles than uniform alloys.

Although material structures comprised of aluminum alloy layers and refractory metal layers offer improvements over uniform alloys, the refractory metal layers can cause severe problems. After initial formation of the structure, aluminum alloy layers and refractory metal layers react, and properties of the interconnect lines degrade as a consequence of the metallurgic reactions. When semiconductor device terminals are contacted directly by lines made of these layered materials, silicon is extracted from the device terminals to such an extent that circuits fail. See K. Hinode, N. Owada, T. Terada and S. Iwata, "Silicon Take-Up by Aluminum Layered with Refractory Metals", IEEE Transactions on Electron Devices, Vol ED-34, pp 700-705, 1987 and R. E. Jones and L. D. Smith, "Contact Spiking and Electromigration Passivation Cracking Observed for Titanium Layered Aluminum Metallization", Proceeding of the IEEE VLSI Multilevel Interconnect Conference, 1985. A barrier must, therefore, be interposed between the interconnect line and the terminal of the semiconductor device to prevent silicon extraction if layered structures are used for interconnect lines in VLSI circuits.

A metallurgic barrier can be produced by depositing titanium nitride (TiN) over the device terminals, but semiconductor device characteristics may be degraded. TiN films can be formed by reactive sputtering of titanium in a nitrogen atmosphere, but the as-deposited films exhibit compressive stresses at sufficient levels to cause cracking and peeling of the films during thermal cycles subsequent to film deposition. See I. Suni, M.

Maenpaa, and M. A. Nicolet, "Thermal Stability of Hafnium and Titanium Nitride Diffusion Barriers in Multilayer Contacts to Silicon", Journal of the Electrochemical Society, 130 No. 5, pp 1215–1218, 1983. Incorporation of oxygen in the TiN can be used to reduce compressive stress in the films, but incorporation of oxygen in sufficient concentrations to reduce stress results in a significant increase in the electrical resistance of the TiN film. See S. S. Ang, "Titanium Nitride Films with High Oxygen Concentration", Journal of Electronic Materials, Vol. 17 No. 2, pp 95–100, 1988. Also, because a thin (10 to 20 Angstroms) layer of silicon oxide rapidly forms on exposed silicon surfaces, it is unlikely that TiN films, especially TiN films which incorporate oxygen, can form reliable, low-resistance contacts to silicon semiconductor terminals. The combined resistance of the TiN film and TiN-silicon interface is in series with a semiconductor device terminal and will cause degradation in the characteristics of the semiconductor device.

A two-step process has been described for forming low-resistance electrical contacts to semiconductor device terminals and metallurgic barriers over the terminals. See P. J. Rosser and G. J. Tomkins, "Self Aligned Nitridation of $TiSi_2$: A $TiN/TiSi_2$ Contact Structure," Material Research Society Symposium Proceedings, 1985. Titanium is deposited on the semiconductor wafer, preferably using a sputtering process. The titanium is reacted with silicon and nitrogen during a first thermal cycle to form a rather thick layer of titanium disilicide within the surface region of the semiconductor device terminals and a rather thin layer of titanium oxynitride over the surface of the device terminals. Because impurities tend to segregate into the oxynitride layer and because unreacted titanium may remain after the first thermal cycle, the titanium oxynitride layer and any residual titanium are then removed by etching with a suitable chemical solution. A portion of the titanium disilicide ($TiSi_2$) is converted to titanium nitride (TiN) during a second thermal cycle in a nitrogen atmosphere. The final structure at the device terminals is a $TiSi_2$ layer to provide an electrical contact and an overlying TiN layer to provide a metallurgic barrier.

Although it produces a low-resistance electrical contact and a metallurgic barrier, the above-described process has inherent disadvantages. During the first thermal cycle too much silicon is consumed from the device terminals, because a rather thick layer of $TiSi_2$ must be formed. Control of the $TiSi_2$ and TiN thicknesses is very difficult, because reactions proceed rapidly at the temperature required to form $TiSi_2$ and the thicknesses are controlled by the duration of the thermal cycle. Finally, the above-described process is rather complex and difficult to apply in volume manufacturing.

A good metallurgic barrier and a low-resistance electrical contact can be simultaneously formed. See E. H. Stevens, P. J. McClure and C. W. Hill, "Semiconductor Contact Silicide/Nitride Process with Control for Silicide Thickness," U. S. Pat. No. 4,784,973. First, a very thin (10 to 20 Angstroms) control layer of silicon oxide or silicon oxynitride is grown over the silicon surfaces that are exposed at contact openings to terminals of semiconductor devices. Then, a layer of titanium (Ti) is deposited under high vacuum conditions. Next, the titanium is reacted with nitrogen or ammonia at a temperature of 600 to 700 degrees centigrade to simultaneously form a thin (0.05 to 0.1 micrometers) layer of titanium disilicide ($TiSi_2$) within the silicon and layer of TiN of 0.05 to 0.2 micrometers thickness over the silicon. The control layer of silicon oxide or silicon oxynitride allows the relative thicknesses of the TiN and $TiSi_2$ to be controlled. The control layer also supplies small amounts of oxygen and nitrogen for incorporation in the TiN film. The $TiSi_2$ layer forms a reliable, low-resistance electrical contact between silicon and TiN. The TiN layer with trace amounts of oxygen and excess nitrogen incorporated in its grain boundaries provides a reliable metallurgic barrier which has an acceptable value for electrical resistance. These simultaneously-formed barriers and contacts were improvements over previous approaches, and were successfully used in conjunction with interconnect lines made of aluminum alloys layered with refractory metals to manufacture VLSI memory circuits.

The method described above can be used to simultaneously produce good metallurgic barriers and good electrical contacts between the barriers and silicon at semiconductor device terminals, but the method is somewhat difficult and expensive to apply in volume manufacturing of VLSI circuits. Growth of very thin control layers with predictable properties is difficult. Because the titanium layer must be deposited under high vacuum conditions to prevent incorporation of too much oxygen, expensive vacuum deposition equipment is required, and the interior of the equipment must be kept extremely clean. During the reaction of titanium in a furnace to form the TiN and $TiSi_2$ layers, oxygen and other trace contaminants must be held to low concentration levels. Thus, furnace maintenance must be done thoroughly and frequently.

Although simultaneously-formed TiN layers for metallurgic barriers and $TiSi_2$ layers for contacts between TiN and silicon allow the use of layered material structures for VLSI circuit interconnect lines, the layered material structure of the interconnect lines can still cause reductions in VLSI circuit performance and reliability. To sufficiently increase the current-carrying capacity and mechanical strength of narrow interconnect lines, thicknesses of the refractory metal layers must be in the range of 0.02 to 0.05 micrometers. During thermal cycles subsequent to deposition of the layered material structure, the refractory metal layers react with aluminum to form compounds which exhibit high electrical resistivities. Hence, resistances of interconnect lines made of layered structures can be significantly higher than resistances of lines made of uniform aluminum alloys. The consequence of increased interconnect line resistances is reduced VLSI circuit performance. Aluminum can react with TiN and after sufficient time the TiN barriers may develop imperfections. See M. Wittmer, "Interfacial Reactions Between Aluminum and Transition-Metal Nitride and Carbide Films", Journal of Applied Physics, Vol. 53, No. 2, pp. 1007–1012, 1982. Because aluminum-refractory metal compounds absorb silicon to high concentrations, silicon will be extracted from a terminal of a semiconductor device and absorbed in the intermetal compounds if even the slightest imperfection develops in a TiN barrier.

The coating applied over the integrated circuit cannot be expected to provide both mechanical support for the interconnect pattern and protection for the underlying circuit. At completion of circuit manufacturing, the coating is often in a state of compressive stress; consequently, because it is in direct contact with the interconnect pattern, the coating transmits a tensile stress to the interconnect lines and weakens the lines. If special care is taken to form the coating in a state of high tensile stress, the interconnect lines are strengthened, but the high tensile stress can cause the coating to crack and, as a consequence, fail to protect the integrated circuit.

If interconnect lines are made using a mechanically strong layered material structure and if the lines are additionally strengthened by applying a protective coating in a state of moderate tensile stress, reliable VLSI circuits can be manufactured.

Electrical connections to integrated circuits are made at bond pads which are usually placed around the circuit chip perimeter. The most commonly used means of establishing electrical connections is a thermocompression bond between the bond pad and a small diameter gold or aluminum alloy wire. Recently, there has been a trend to establish electrical connections by soldering the chips to a conductor pattern on a suitable substrate or by attaching one end of metal alloy tabs to the integrated circuit bond pads and subseqently attaching the other end of the tabs to a conductor pattern on a substrate. See P. Singer, "Multi-chip Packaging on Silicon Substrates," Semiconductor International, p. 34, June 1987, and R. Bowlby, "The DIP May Take its Final Bows," IEEE Specturm, pp. 37–42, June, 1985.

In addition to having sufficient mechanical strength and low electrical resistance, the interconnect material structure must be compatible with the means employed to make electrical contacts to the integrated circuit. If thermocompression bonding of gold wires is employed, the uppermost layer of the material structure cannot be a refractory metal unless a layer of appropriate material is added over the bond pads. If either soldering to conductor patterns on a substrate or attachment of metal tabs is employed, the uppermost layer of the interconnect material structure must either be a metallurgic barrier or a barrier layer must be added over the bond pads.

Bond pads occupy significant area on the surface of VLSI circuits. Severe deformations of the bond pad materials are produced during the thermocompression bonding of wires to the pads. In the prior art, semiconductor devices are not placed beneath bond pads in high reliability circuits, because the deformations produced during bonding can be transmitted to the underlying devices and thereby damage those devices. If semiconductor devices could be placed beneath bond pads, areas and manufacturing costs of VLSI circuits would be reduced and performances of VLSI circuits would be increased.

In view of the foregoing background it can be seen that there is a need in the art for an improved material structure for use in contacting and interconnecting semiconductor devices within VLSI circuits and a process which is amenable to volume manufacturing for forming the improved material structure.

SUMMARY OF THE INVENTION

To overcome deficiencies in the prior art, a structure and process have been invented for contacting and interconnecting semiconductor devices within an integrated circuit. The first broad aspect of this invention is a multi-region material structure that is used to establish contacts to semiconductor device terminals and to form lines which establish electrical connections among the semiconductor devices. Incorporated within the material structure are regions that: (1) provide low-resistance electrical contacts between semiconductor device terminals and interconnect lines without damaging the semiconductor and interconnect line materials; (2) provide a primary current-carrying path of low electrical resistance; (3) provide a secondary current-carrying path in parallel with the primary path to enhance the reliability of interconnect lines; (4) impede unwanted reactions between adjacent regions within the interconnect lines and also form strong bonds between these adjacent regions; (5) greatly increase the mechanical strength of interconnect lines without significantly increasing the electrical resistance of the lines; (6) and provide a metallurgic barrier at the upper surface of the interconnect lines. As a result of the new structure devised for interconnect lines, the reliability of VLSI circuits manufactured using the new structure of the present invention surpasses that attainable in VLSI circuits constructed according to the prior art. Because the uppermost region of the interconnect structure is a metallurgic barrier, formation of electrical connections to the integrated circuit at the bond pads is facilitated. Because the multi-region material structure of the present invention produces circuit bond pads which have exceptional mechanical strength, semiconductor devices may be placed beneath those circuit bond pads with a resultant decrease in circuit area and consequent decrease in manufacturing cost and increase in circuit performance. A second broad aspect of the present invention is a process for forming the multi-region material structure. The process is such that thicknesses and material properties of the various regions within the material structure can be accurately controlled. The process is amenable to volume manufacturing of VLSI circuits because it can be controlled and because the conditions required during formation of the various material regions can be readily attained using currently available manufacturing equipment.

DETAILED DESCRIPTION OF THE INVENTION

Figure 1:
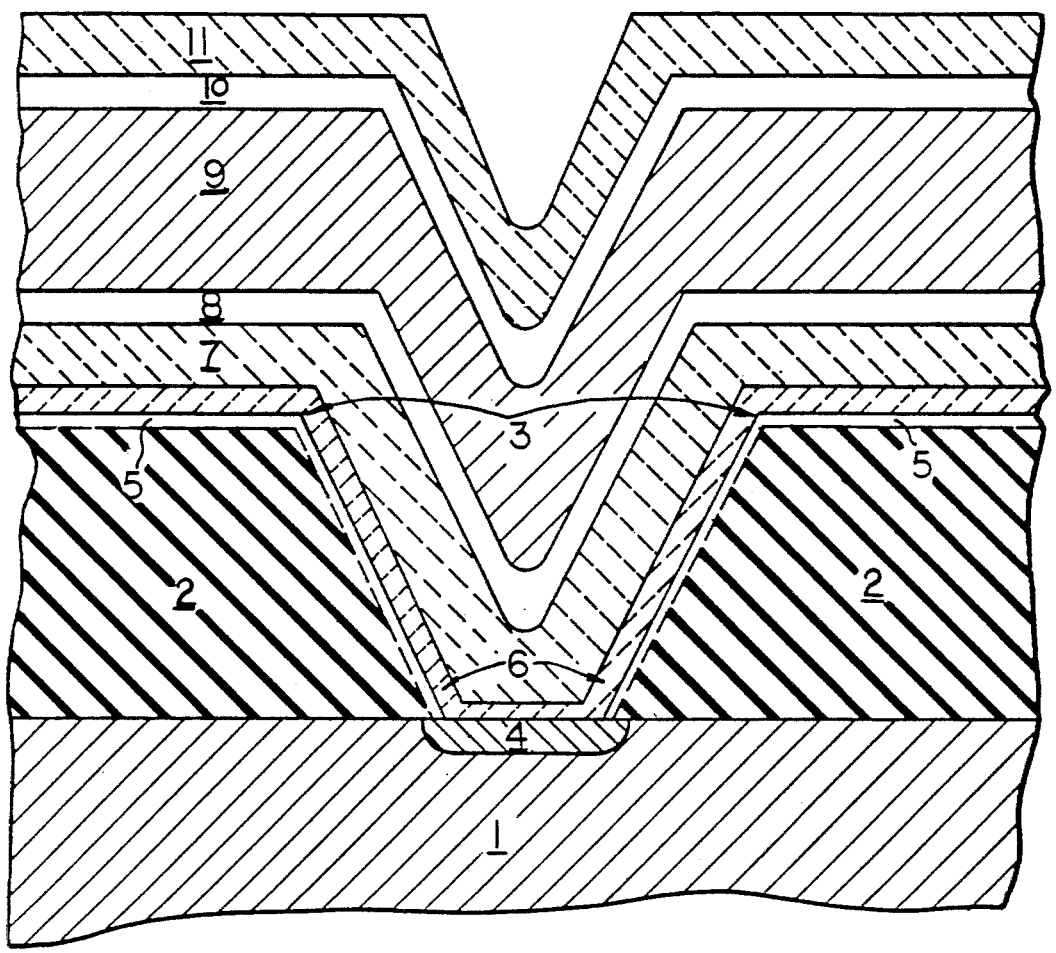
FIG. 1 is a diagram illustrating a cross-sectional view of an integrated circuit in accordance with the present invention that shows the material structure in the vicinity of a semiconductor device terminal.

The structure and process of the present invention may be understood with reference to the six appended drawing figures. Referring now to FIG. 1, there is shown a representative cross-sectional view of various material regions within a VLSI circuit that includes a region 1 comprising a semiconductor wafer. The preferred semiconductor for the manufacture of VLSI circuits is silicon. Region 2 comprises a dielectric layer which is either grown on or deposited on the surface of semiconductor wafer region 1. Preferred materials for region 2 are silicon oxide, silicon oxynitride, and silicon nitride. Thickness for region 2 typically range from 0.2 to 2.0 micrometers. Region 3 represents a contact opening etched through region 2 by appropriate chemical means to provide access to the surface of semiconductor wafer region 1 at a terminal of a semiconductor device. The walls which bound region 3 should be sloped as shown to permit good coverage of deposited materials on the walls and on the surface of semiconductor wafer region 1. Region 4 comprises a metal silicide, whose primary function is to provide a low resistance electrical contact between regions 1 and 6. Several regions comprise compounds which have a refractory metal as a constituent. A deposited refractory metal, such as titanium, tantalum, molybdenum, vanadium or tungsten reacts with semiconductor wafer region 1 to form metal silicide region 4, reacts with dielectric layer region 2 to form region 5, and is converted to a metal oxynitride comprising region 6 during an elevated temperature cycle. In forming metal silicide region 4 and metal oxynitride region 6, thin films of silicon oxide or contaminants which might have existed just above the surface of semiconductor wafer region 1, contaminants which might have existed just beneath the surface of semiconductor wafer region 1, and a portion of the deposited refractory metal are incorporated in region 6. Small concentrations of some contaminants and a portion of the deposited refractory metal are incorporated in region 4. Structural flaws which might have existed just beneath the surface of the semiconductor wafer region 1 are removed by material movements which occur in forming regions 4 and 6 during the elevated temperature cycle. Preferred thicknesses for metal silicide region 4 range from 0.01 to 0.1 micrometers. Region 5 is a material bonding layer formed by reaction between the refractory metal and dielectric region 2. Preferred thicknesses for the material bonding region 5 range from 0.002 to 0.01 micrometers. Preferred thicknesses for metal oxynitride region 6 range from 0.01 to 0.1 micrometers. The preferred refractory metal is titanium, and the preferred silicide is titanium disilicide ($TiSi_2$). Metal oxynitride region 6 is the first layer in a composite metallurgic barrier. In metal oxynitride region 6, current flow is required only through the thin layer interposed between metal silicide region 4 and region 7. Thus, the barrier properties of metal oxynitride region 6 may be optimized without much concern about maintaining a low electrical resistivity for this region. The preferred composition for metal oxynitride region 6 is of the form Metal-$O_{x-}N_y$, with x-values in the range of 0.05 to 0.2 and corresponding y-values in the range of 0.95 to 0.8. Region 7 is the second layer of the composite metallurgic barrier. In accordance with the present invention, region 7 not only serves as a metallurgic barrier but also a current-carrying path around small voids which might form in region 9 after thermal cycles. Current between metal silicide region 4 and region 9 also flows through region 7. Because it provides a current path in parallel to region 9, region 7 must have relatively low electrical resistivity. Because its resistivity is on the order of 50 micro-ohm-centimeters and because of its good properties as a metallurgic barrier, low oxygen content titanium nitride is the preferred material for region 7. Preferred thicknesses for region 7 are in the range of 0.05 to 0.2 micrometers. Region 8 is formed by depositing a layer of titanium and subsequently reacting the titanium with materials from regions 7 and 9 during an elevated temperature cycle. Region 8 comprises silicon dissolved to the saturation concentration in an aluminum-titanium compound. Region 8 may also contain oxygen and nitrogen. The silicon dissolved in region 8 is extracted from region 9. Preferred thicknesses for region 8 range from 0.005 to 0.02 micrometers. Region 8 forms a strong bond between regions 7 and 9. Region 8 also serves as a barrier to impede unwanted reactions between regions 7 and 9. Region 9 is an aluminum alloy. The preferred alloy incorporates silicon in concentrations ranging from 0.1 to 1.0 percent and titanium in concentrations ranging from 0.1 to 2.0 percent. The preferred thickness of region 9 ranges from 0.3 to 1.0 micrometers. Silicon from region 9 is consumed in the formation of regions 8 and 10. Silicon, titanium and aluminum form compounds which precipitate in the grain boundaries of region 9. Region 10 is of the same composition as region 8, is formed in the same manner as region 8, and like region 8, forms a bond between and impedes unwanted reactions between the two regions 9 and 11 which it joins. Region 11 is a deposited layer of titanium oxynitride ($TiO_xN_y$) with x-values between 0.1 and 0.3 and corresponding y-values between 0.9 and 0.7. The primary functions of region 11 are to add mechanical strength to the multi-region material structure, and, in some applications, to provide a top-side metallurgic barrier. To help hold the underlying aluminum alloy layer region 9 together, it is preferred that region 11 be in a state of tensile stress. Tensile stress can be established in region 11 by depositing titanium oxynitride of an appropriate composition. Preferred thicknesses of region 11 range from 0.05 to 0.5 micrometers.

Figure 2:
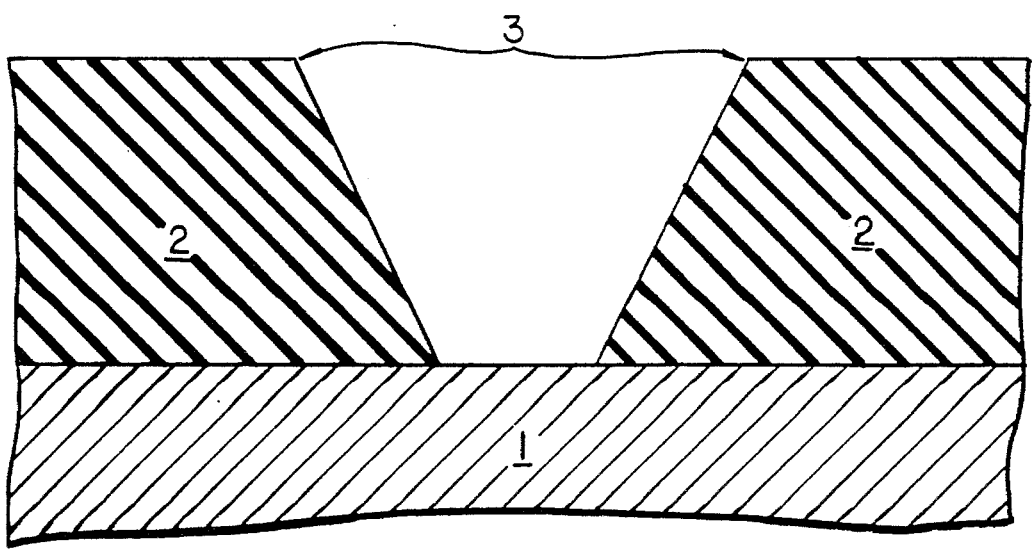
FIG. 2 is a diagram illustrating a portion of the material structure of FIG. 1 which exists at an intermediate step in the process of the present invention.
Figure 3:
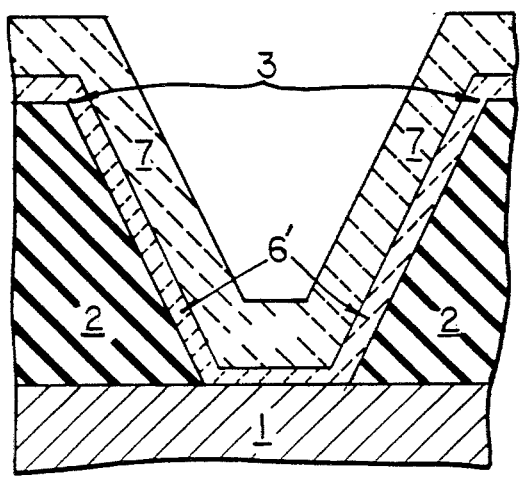
FIG. 3 is a diagram illustrating a portion of the material structure of FIG. 1 which exists at a step in the process of the present invention subsequent to that shown in FIG. 2.
Figure 4:
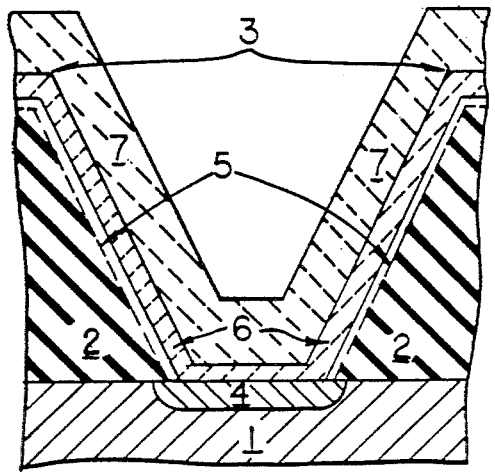
FIG. 4 is a diagram illustrating a portion of the material structure of FIG. 1 which exists at a step in the process of the present invention subsequent to that shown in FIG. 3.

The process employed to produce the structure hereinabove described may now be understood with reference to FIGS. 2-4. A contact opening through the dielectric region 2 to the surface of semiconductor wafer region 1 is shown in FIG. 2. The opening may be formed with sloped walls by a suitable combination of plasma and wet chemical etching processes. The opening after deposition of refractory metal region 6' and titanium nitride region 7 is illustrated in FIG. 3. To allow optimization of the barrier properties of the subsequently-formed region 6, oxygen and nitrogen may be incorporated in region 6' during its deposition. The material structure of FIG. 3 is converted to the structure of FIG. 4 by a thermally activated reaction in an ammonia ($NH_3$) atmosphere, or other nitrogen containing atmosphere. During the reaction, region 5 is formed by reduction of the surface of dielectric region 2, metal silicide region 4 is formed by reaction of the refractory metal with the semiconductor wafer region 1, and the portion of region 6' that is not consumed in forming regions 4 and 5 is converted to the metal oxynitride region 6. Also during the reaction with ammonia, excess nitrogen is incorporated in the grain boundaries of regions 6 and 7 and stresses in regions 6 and 7 are somewhat relieved. Stress relief may occur through grain regrowth and material movement along the interface between regions 6 and 7. Region 4 and the portion of region 6 that lies above region 4 are formed in reactions which compete for consumption of the refractory metal. Therefore, the thickness of region 4 can be controlled through appropriate choices of reaction temperature and the deposited thicknesses of regions 6' and 7. The preferred thermal reaction cycle is performed in a rapid thermal processing machine with heat supplied by high-intensity infrared lamps. The temperature in the preferred cycle may range from 550 to 900 degrees centigrade. The duration of the preferred cycle may range from 0.5 to 5.0 minutes. After the thermal treatment in ammonia, the semiconductor wafer is returned to a vacuum deposition machine for deposition of the layers which form the regions 8, 9, 10, and 11 illustrated in FIG. 1. After all vacuum depositions have been completed, a thermal anneal is performed in a hydrogen-nitrogen atmosphere at a temperature ranging between 400 and 450 degrees centigrade for a duration of 10 to 60 minutes. The reactions which produce the final compositions of the multi-region material structure occur during this post-deposition anneal cycle.

Referring again to FIG. 1, the structure and process of this invention produce a metallurgic barrier between the semiconductor wafer and the interconnect lines which is a significant improvement over the prior art. Because the structure is a composite of regions 6 and 7, the process used in forming metal-oxynitride region 6 may be adjusted such that the barrier properties of this region are optimized. The process used in forming region 7 may be adjusted to yield the best barrier properties that are consistent with maintaining an electrical resistivity of less than 50 to 60 micro-ohm-centimeters for region 7. Low-oxygen-content titanium nitride meets the resistivity requirement for region 7, and it also has good properties as a metallurgic barrier. The ammonia atmosphere used in the present invention for simultaneously forming regions 4, 5, and 6 and annealing region 7 allows relief of the high compressive stress levels that are usual in low-oxygen-content titanium nitride films. During the heat treatment in ammonia, small cracks and other structural defects, which might be introduced in regions 6 and 7 during film deposition or during stress relief, have a chance to regrow and heal. Finally, because the metallurgic barrier of the present invention is comprised of two regions which undergo different processing sequences, it is unlikely that contaminant-induced structural flaws will simultaneously pierce both regions and cause barrier failures. In the prior art, high compressive stresses and structural flaws have caused failures in metallurgic barriers of titanium nitride.

Referring again to FIG. 1, the structure and process of this invention produce interconnect lines which are superior to the prior art in terms of reliability and electrical properties. The interconnect lines in this invention are strengthened by regions 7 and 11, which interact only weakly, if at all, with the primary current-carrying layer, region 9. Furthermore, regions 8 and 10 are included in this invention to impede unwanted interactions between regions of the material structure. In the prior art, interconnect lines are strengthened by regions of a refractory metal, and the refractory metal regions interact very strongly with the primary current/carrying regions to produce significant and undesirable increases in electrical resistances of interconnect lines. Because region 11 can be formed in a state of tensile stress, the underlying layers of the interconnect structure can be strengthened. The tensile stress in region 11 transmits a compressive stress to the underlying regions, and thereby acts to eliminate or greatly reduce the number of cracks and voids which form in region 9 during temperature cycling of the interconnect structure. The higher conductivity region 7 of the interconnect-to-contact barrier acts as a redundant current-carrying path in parallel with the primary current path through region 9. Because titanium nitride is mechanically strong, it is unlikely that cracks, voids and other structural flaws which might form in region 9 will coincide with a fracture in region 7. Thus, the redundancy provided by region 7 in parallel with region 9 will greatly enhance the reliability of interconnect lines that are made in the structure of the present invention. Even when layered structures are used in accordance with the prior art, the effectiveness of parallel-path redundancy is reduced because the refractory metal and aluminum layers of the prior art intermix.

Referring again to FIGS. 3 and 4, the process used in this invention for forming the interconnect-to-contact barrier permits better control of the thicknesses of the metal-silicide contact region 4 and the metallurgic barrier region 6 than can be achieved using the prior art. The reaction rate for forming region 4 has a different temperature dependence than the reaction rate for forming region 6. Thus, the relative thicknesses of regions 4 and 6 are influenced by the reaction temperature. Because the nitrogen consumed in converting material from region 6' to region 6 is supplied from ammonia gas present in the reaction chamber atmosphere, the rate of formation of region 6 is influenced by the composition of the gas mixture used as the reacton chamber atmosphere. Because the nitrogen consumed in forming region 6 must be supplied by diffusion of nitrogen or ammonia through region 7, the rate of formation of region 6, is influenced by the thickness of region 7. After the deposited refractory metal, region 6' in FIG. 3, has been consumed, the surface of region 4 proceeds to convert to a metal nitride, and thereby, the thickness of region 4 proceeds to decrease while the thickness of region 6 proceeds to increase. The presence of region 7 during the formation of regions 4 and 6 provides a means in addition fixing the duration and temperature of the reaction cycle for controlling the relative thicknesses of regions 4 and 6. In addition, the presence of region 7 reduces the rate with which region 4 is converted to region 6 after region 6' has been consumed. Thus, the process of this invention is much less sensitive to reaction cycle duration than processes of the prior art. In summary, the process of this invention permits accurate control of the thicknesses of regions 4 and 6 by choosing appropriate values for the deposited thickness of region 6', the deposited thickness of region 7, the composition of the gas mixture in the reaction chamber, the reaction temperature, and the duration of the elevated temperature reaction cycle.

Referring to FIG. 3, the process of this invention is more amenable to volume manufacturing than the best process available in the prior art. Growth of very thin control layers of known composition is not required. Oxygen is incorporated in region 6' by choice. Thus, vacuum deposition under extremely low oxygen partial pressure is not required. In this invention, region 7 is formed by reactive sputtering of titanium in a nitrogen-containing plasma to form titanium nitride (TiN). Because the already-formed TiN is much less reactive than Ti and because TiN is a diffusion barrier to most contaminants, the process of the present invention for forming regions 4, 5, 6, and 7 is not as sensitive to trace amounts of contaminant gases as the processes available in the prior art.

Figure 5:
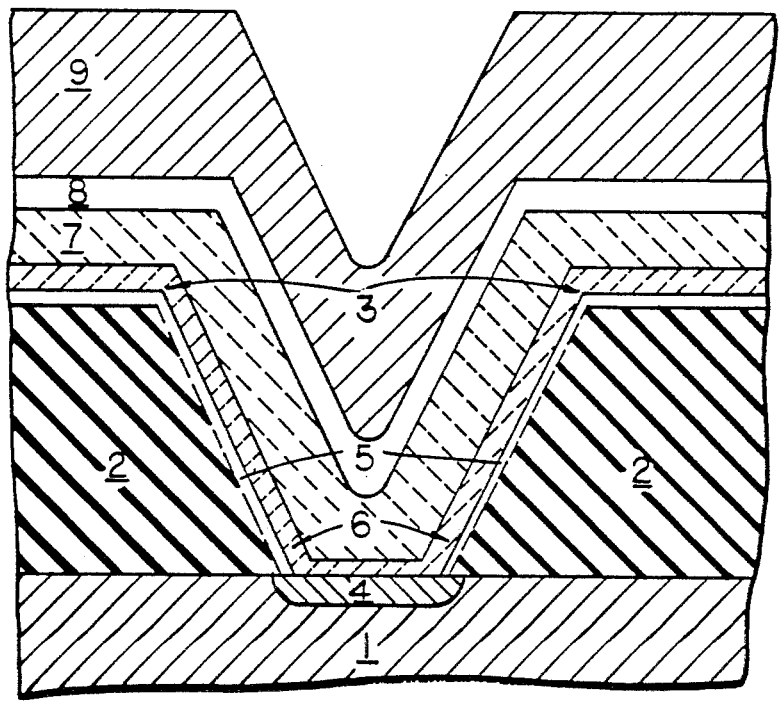
FIG. 5 is a diagram illustrating a cross-sectional view of an integrated circuit having a more simplified material structure than that shown in FIG. 1.

The cross section of a simplified structure is illustrated in FIG. 5. Compared to FIG. 1, the structure of FIG. 5 does not include regions 10 and 11. For manufacturing processes in which the wafer is exposed to only relatively low temperatures of less than 200 to 400 degrees centigrade after interconnect forming and patterning, the simplified material structure shown in FIG. 5 may be sufficient.

Figure 6:
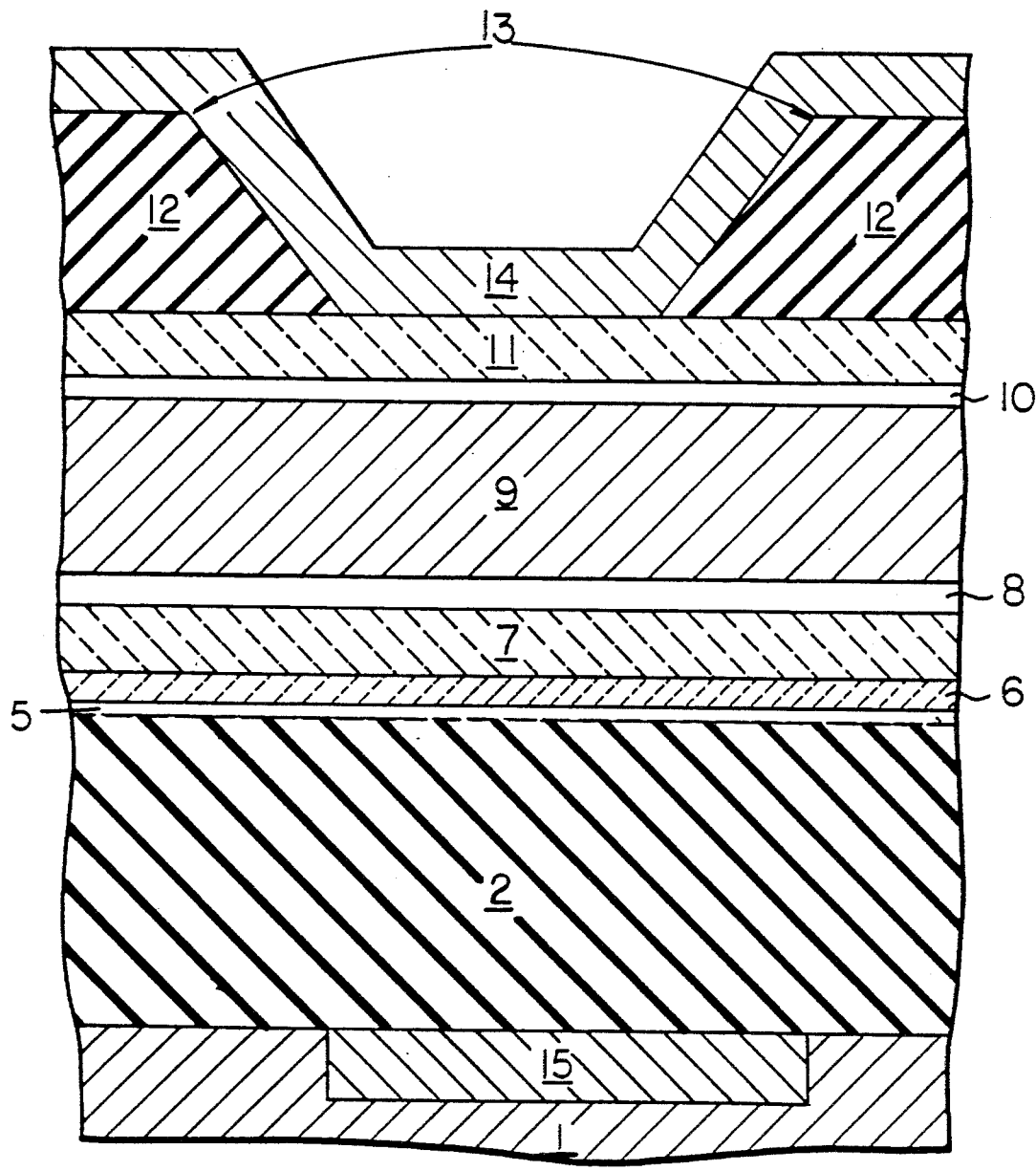
FIG. 6 is a diagram illustrating a cross-section view of an integrated circuit having regions additional to the material structure shown in FIG. 1 to facilitate making electrical connections at the circuit bond pads of the integrated circuit.

A cross section of the material structure in the vicinity of an integrated circuit bond pad is shown in FIG. 6. Illustrated, in addition to the regions of FIG. 1, are the protective coating region 12, the bond pad opening region 13, a region 14 added to facilitate making electrical connections to the circuit bond pads, and a region 15 occupied by semiconductor devices within the semiconductor wafer region 1. Preferred materials for region 12 are silicon oxide, silicon oxynitride, silicon nitride, polyamides, or composite layers of two or more of these materials. Preferred thicknesses for region 12 range from 1.0 to 2.0 micrometers. Region 13 is a bond pad opening etched through region 12 by appropriate chemical means. Depending on whether thermocompression wire bonds, solder bumps or metal alloy tabs are used to make electrical connections to the integrated circuit, the preferred material for region 14 may be either an aluminum alloy, a gold alloy, or a composite structure of several metal layers. Thicknesses of region 14 may range from 1.0 to several micrometers. The semiconductor devices in region 15 are comprised of the typical semiconductor regions used to form these semiconductor devices.

Referring again to FIG. 6, region 14, which often contains gold, is required in several of the methods now being use to make electrical contacts to VLSI circuits. In the present invention, region 14 may be formed directly on the interconnect structure because of the good metallurgic barrier properties of region 11. In the prior art, a metallurgic barrier must be formed over the interconnect structure at bond pad openings before region 14 can be formed, because region 14 would otherwise react very strongly with the interconnect material structures of the prior art.

Referring again to FIG. 6, a region 15 containing semiconductor devices may be located beneath bond pads in the present invention. Because the interconnect structure of the present invention incorporates the mechanically strong regions 7 and 11, the structure can withstand thermocompression bonding without transmitting deformation-induced damage to the underlying devices in region 15. In the prior art, the interconnect structure is not strong enough to allow the location of semiconductor devices under the bond pads of high-reliability VLSI circuits. Compared to a circuit layout in the prior art without devices beneath the bond pads, a layout with devices beneath the bond pads will result in a smaller circuit area and a proportionately lower manufacturing cost per circuit. In addition, a smaller circuit area will result in a higher circuit performance, because signal path lengths will on average be shorter.

I claim:

1. A process for forming a multi-region material structure for contacting and interconnecting semiconductor devices within a VLSI circuit, the process comprising:

providing a semiconductor wafer upon which the multi-region material structure is to be formed;

providing a first dielectric region overlying the semiconductor wafer, said first dielectric region including openings therein for permitting electrical contact to terminals of the semiconductor devices;

providing a low-resistance contact region in the semiconductor wafer underlying the openings in said first dielectric region;

providing a first metallurgic barrier region overlying the first dielectric region and the low-resistance contact region, said first metallurgic barrier region comprising a compound of a refractory metal, oxygen, and nitrogen, said compound being established by a process that causes oxygen to be incorporated within said refractory metal and by a further process that includes reacting in a nitrogen-containing atmosphere;

providing a first material bonding region sandwiched between said first metallurgic barrier region and said first dielectric region;

providing a metallurgic barrier and current carrying region overlying said first metallurgic barrier region, said metallurgic barrier and current carrying region comprising a compound of a refractory metal, oxygen, and nitrogen that is different from the compound comprising said first metallurgic barrier region, said-metallurgic barrier and current carrying region having a resistivity of less than 60 micro-ohm-centimeters, said compound comprising said metallurgic barrier and current carrying region being established by a process that includes reactive sputter deposition;

providing a primary current carrying path region overlying said metallurgic barrier and current carrying region, for providing, in combination with said metallurgic barrier and current carrying region, a composite path for carrying current between interconnected semiconductor devices; and providing a second material bonding region sandwiched between said metallurgic barrier and current carrying region and said primary current carrying path region.

2. A process for forming a multi-region material structure for contacting and interconnecting semiconductor devices within a VLSI circuit as in claim 1, further comprising:

providing a second metallurgic barrier region overlying said primary current carrying path region for providing additional mechanical strength to said material structure; and providing a third material bonding region sandwiched between said second metallurgic barrier region and said primary current carrying path region.

3. A process for forming a multi-region material structure for contacting and interconnecting semiconductor devices within a VLSI circuit as in claim 2, further comprising:

providing a second dielectric region overlying said second metallurgic barrier region, said second dielectric region including openings therein for permitting electrical contact to VLSI circuit bond pads; and providing an electrical connection region overlying said second dielectric region and directly interfacing with said second metallurgic barrier region at the openings in said second dielectric region.

4. A process for forming a multi-region material structure for contacting and interconnecting semiconductor devices within a VLSI circuit as in claim 1 wherein said low-resistance contact region, said first metallurgic barrier region, said first material bonding region, and said metallurgic barrier and current carrying region are each formed by: (1) depositing a refractory metal region overlying said first dielectric region and said semiconductor wafer at the openings provided in said first dielectric region; (2) depositing, by a reactive sputtering process, a titanium nitride region overlying said refractory metal region; and (3) reacting said refractory metal region with the overlying titanium nitride region and the underlying first dielectric region and semiconductor wafer in a nitrogen-containing atmosphere.

5. A process for forming a multi-region material structure for contacting and interconnecting semiconductor devices within a VLSI circuit as in claim 4 wherein said nitrogen-containing atmosphere comprises a mixture of an inert gas and ammonia.

6. A process for forming a multi-region material structure for contacting and interconnecting semiconductor devices within a VLSI circuit as in claim 1 wherein said primary current carrying path region and said second material bonding region are formed by first depositing a titanium region overlying the metallurgic barrier and current-carrying region and an aluminum alloy region overlying said titanium region and by then reacting said titanium region with the underlying metallurgic barrier and current-carrying region and the overlying aluminum alloy region.

7. A process for forming a multi-region material structure for contacting and interconnecting semiconductor devices within a VLSI circuit as in claim 2 wherein the second metallurgic barrier region and the third material bonding region are formed by first depositing a titanium region overlying the primary current carrying path region, by then depositing, by a reactive sputtering process, a titanium oxynitride region overlying said titanium region, and by then reacting said titanium region with the underlying primary current carrying path region and the overlying titanium oxynitride region.

8. A process for forming a multi-region material structure for contacting and interconnecting semiconductor devices within a VLSI circuit as in claim 4 wherein oxygen is incorporated in said refractory metal region during deposition of said refractory metal region.

9. A process for forming a multi-region material structure for contacting and interconnecting semiconductor devices within a VLSI circuit as in claim 4 wherein oxygen and nitrogen are incorporated in said refractory metal region during deposition of said refractory metal region.

10. A process for forming a multi-region material structure for contacting and interconnecting semiconductor devices within a VLSI circuit as in claim 4 wherein said reacting is performed in a thermal processing machine that supplies heat from high-intensity infrared lamps.

11. A process for forming a multi-region material structure for contacting and interconnecting semiconductor devices within a VLSI circuit as in claim 4 wherein said electrical contact region, said first material bonding region, said first metallurgic barrier region, and said metallurgic barrier and current carrying region are subjected to a final heat treatment in a gas mixture that comprises hydrogen and nitrogen.

12. A process for forming a multi-region material structure for contacting and interconnecting semiconductor devices within a VLSI circuit as in claim 6 wherein said second material bonding region and said primary current carrying path region are subjected to a final heat treatment in a gas mixture that comprises hydrogen and nitrogen.

13. A process for forming a multi-region material structure for contacting and interconnecting semiconductor devices within a VLSI circuit as in claim 7 wherein said third material bonding region and said second metallurgic barrier region are subjected to a final heat treatment in a gas mixture that comprises hydrogen and nitrogen.

14. A process for forming a multi-region material structure for contacting and interconnecting semiconductor devices within a VLSI circuit as in claim 2 wherein said second metallurgic barrier region is formed in a state of tensile stress.

15. A process for forming a multi-region material structure for contacting and interconnecting semiconductor devices within a VLSI circuit as in claim 3 wherein said second dielectric region is formed in a state of tensile stress.

16. A process for forming a multi-region material structure for contacting and interconnecting semiconductor devices within a VLSI circuit as in claim 2 wherein said second metallurgic barrier region comprises titanium oxynitride having an oxygen to nitrogen ratio within the range of 0.1 to 0.4.

17. A process for forming a multi-region material structure for contacting and interconnecting semiconductor devices within a VLSI circuit as in claim 2 wherein said second metallurgic barrier region has a thickness of between 0.05 and 0.5 micrometers.

* * * * *